United States Patent
Ito

(10) Patent No.: US 8,527,820 B2
(45) Date of Patent: Sep. 3, 2013

(54) SEMICONDUCTOR DEVICE AND TEST METHOD THEREOF

(75) Inventor: Shin Ito, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 282 days.

(21) Appl. No.: 13/022,194

(22) Filed: Feb. 7, 2011

(65) Prior Publication Data

US 2011/0197101 A1 Aug. 11, 2011

(30) Foreign Application Priority Data

Feb. 8, 2010 (JP) ................................. 2010-025335

(51) Int. Cl.
*G11C 29/00* (2006.01)
(52) U.S. Cl.
USPC .......................................... 714/723; 714/718
(58) Field of Classification Search
USPC ........... 369/275.3, 275.5; 711/112; 707/812; 709/203; 370/360; 714/723, 765, 766, 718
See application file for complete search history.

(56) References Cited

U.S. PATENT DOCUMENTS

| | | | |
|---|---|---|---|
| 5,754,521 A * | 5/1998 | Yokota ........................ | 369/275.3 |
| 6,564,346 B1 * | 5/2003 | Vollrath et al. ............... | 714/723 |
| 7,243,189 B2 * | 7/2007 | Nagasoe et al. .............. | 711/112 |
| 7,277,325 B2 | 10/2007 | Fukuda et al. | |
| 7,515,473 B2 | 4/2009 | Fukuda et al. | |
| 8,046,391 B2 * | 10/2011 | Takaoka et al. ............... | 707/812 |
| 8,144,568 B2 * | 3/2012 | Kato et al. .................. | 369/275.5 |
| 8,291,008 B2 * | 10/2012 | Kawaguchi et al. ........... | 709/203 |
| 2007/0274302 A1 * | 11/2007 | Moriya ......................... | 370/360 |

FOREIGN PATENT DOCUMENTS

JP 2006-331611 A 12/2006

\* cited by examiner

*Primary Examiner* — David Ton
(74) *Attorney, Agent, or Firm* — Foley & Lardner LLP

(57) ABSTRACT

A semiconductor device includes a first management area storing a plurality of inspection results, the plurality of inspection results being obtained by executing inspections for each of a plurality of storage areas which store a plurality of data; and a second management area storing the plurality of inspection results. The first and second management areas are independent from each other.

32 Claims, 8 Drawing Sheets

SEMICONDUCTOR DEVICE AND TEST METHOD THEREOF

BACKGROUND OF THE INVENTION

1. Field of the Invention

The present invention relates to a semiconductor device and a test method thereof. More particularly, the present invention relates to a semiconductor device including a first management area and a second management area which provide tests of the semiconductor device.

Priority is claimed on Japanese Patent Application First Publication, No. 2010-025335, filed Feb. 8, 2010, the content of which is incorporated herein by reference.

2. Description of the Related Art

In general, a semiconductor device such as a non-volatile memory (e.g., a NAND type flash memory) includes a plurality of storage blocks for storing data. Among the plurality of storage blocks, abnormal storage blocks exist due to manufacturing failures and the like. The abnormal storage blocks are called bad blocks and are permissible at a predetermined rate or less. Japanese Patent Application First Publication, No. 2006-331611 describes a technique regarding a semiconductor device including a management area for managing positions (addresses) and the like of the bad blocks.

SUMMARY

In one embodiment, a semiconductor device may include, but is not limited to, a first management area storing a plurality of inspection results. The plurality of inspection results are obtained by executing inspections for each of a plurality of storage areas which store a plurality of data. The semiconductor device may include, but is not limited to, a second management area storing the plurality of inspection results. The first and second management areas are independent from each other.

In another embodiment, a semiconductor device may include, but is not limited to, a plurality of main storage areas storing data, and a plurality of first management areas corresponding to the plurality of main storage areas respectively. The plurality of first management areas store a plurality of failure information indicating whether the plurality of main storage areas are failure areas or non-failure areas. The semiconductor device may include a plurality of second management areas respectively indicating whether the plurality of main storage areas are failure areas or non-failure areas. The plurality of second management areas correspond to the plurality of main storage areas respectively, wherein the plurality of first management areas respectively store a plurality of failure information formed by respectively merging a plurality of first inspection results and a plurality of second inspection results. The plurality of first inspection results are obtained by executing a first inspection, the plurality of second inspection results are obtained by executing a second inspection after the first inspection is executed, and the plurality of second management areas respectively store the first inspection results without storing the second inspection results.

In still another embodiment, a semiconductor test method may include, but is not limited to, testing a first inspection with a plurality of storage areas. The first inspection results a plurality of first inspection results. The plurality of storage areas store a plurality of data. The semiconductor test method includes storing the plurality of first inspection results into at least a plurality of second management areas among a plurality of first management areas and the plurality of second management areas corresponding to the plurality of storage areas. The semiconductor test method includes reading the plurality of first inspection results from the plurality of second management areas, and testing a second inspection after the first inspection is executed. The second inspection is executed to a plurality of non-failure areas in the plurality of storage areas based on the plurality of first inspection results of the second management areas. The first inspection results indicate whether the plurality of storage areas are non-failure areas or failure areas. The semiconductor test method includes storing a plurality of second inspection results that indicate the second inspection respectively corresponding to the plurality of non-failure areas of the plurality of storage area into the plurality of first management areas.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail, in order to facilitate the understanding of the present invention. Descriptions will be given below for a circuit having the current source control configuration used as an example of one of different power supply systems.

For example, in order to manage the positions of the bad blocks, the positions of the bad blocks are stored in a management area (a spare area) of a memory array. When storing data in storage blocks of a semiconductor device, information stored in the management area is read and data is stored based on the read information while avoiding bad blocks.

A chip maker stores information indicating bad blocks detected in probe inspection (a wafer test, a pre-processing test) in a semiconductor wafer state in the management area and ships semiconductor chips. At this time, when the ratio of bad blocks with respect to storage blocks provided in the semiconductor chips is equal to or less than a predetermined value, the semiconductor chips are shipped as known good dies (KGDs) which are semiconductor chips with a guaranteed quality.

An assembly maker performs multi-chip package (MCP) mounting with respect to a plurality of purchased KGD chips. The MCP-mounted semiconductor device is subjected to a sorting test (a post-processing test) for detecting a failure having occurred in an assembly process. In the sorting test, a test for bad blocks is omitted (skipped) in order to reduce a test time based on information indicating the bad blocks, which is stored in the management area. Furthermore, the sorting test, for example, is for detecting a connection failure and the like of interconnections for connecting a plurality of semiconductor chips to one another.

Hereinafter, the sorting test will be described with reference to FIGS. 7, 8A, 8B and 8C.

Figure 7:
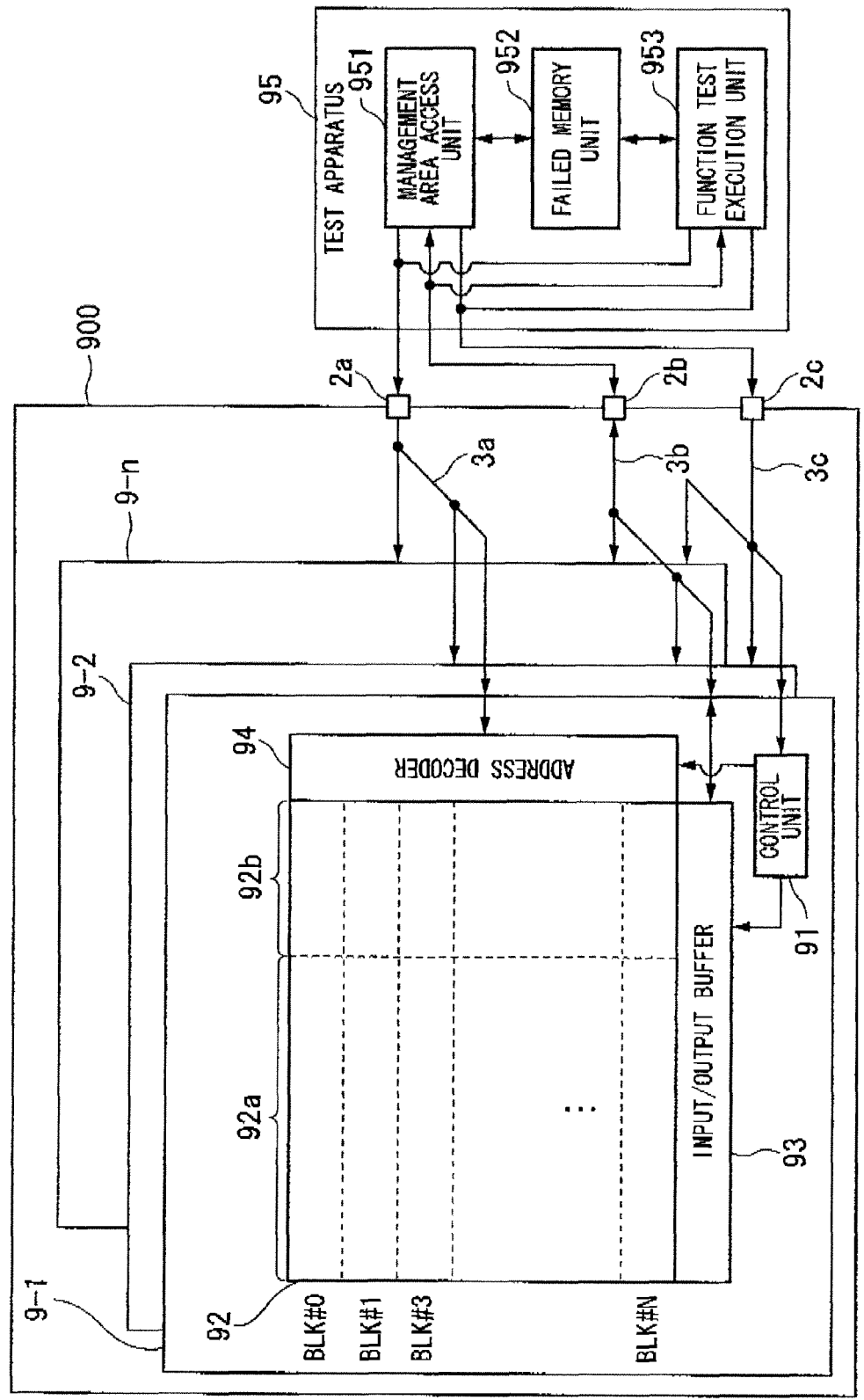
FIG. 7 is a schematic block diagram illustrating the configuration of a semiconductor device and a test apparatus performing a sorting test.

FIG. 7 is a schematic block diagram illustrating the configuration of a semiconductor device 900 and a test apparatus 95 performing a sorting test with respect to the semiconductor device 900.

As illustrated in FIG. 7, the semiconductor device 900 includes n (n is a natural number) semiconductor chips (non-volatile memories) 9-1 to 9-n, an address terminal 2a, a data terminal 2b, a control terminal 2c, connection wirings 3a for connecting the semiconductor chips 9-1 to 9-n to the address terminal 2a, connection wirings 3b for connecting the semiconductor chips 9-1 to 9-n to the data terminal 2b, and connection wirings 3c for connecting the semiconductor chips 9-1 to 9-n to the control terminal 2c.

Each of the semiconductor chips 9-1 to 9-n has the same configuration, and includes a control unit 91, a memory array 92, an input/output buffer 93, and an address decoder 94.

The control unit 91 controls the input/output buffer 93 and the address decoder 94 in response to a control command which is input from the outside through the control terminal 2c.

The memory array 92 includes a plurality of storage blocks BLK#0 to BLK#N (N is a natural number). Each storage block includes a main storage area 92a for storing data which is input from the outside of the semiconductor device 900 through the input/output buffer 93, and a management area 92b for storing information indicating whether a failure has occurred or not in the main storage area 92a.

In the case of writing data to the memory array 92, the input/output buffer 93 amplifies a signal level of data which is input from the data terminal 2b and outputs the amplified data to the memory array 92 under the control of the control unit 91. Furthermore, in the case of reading data from the memory array 92, the input/output buffer 93 amplifies a signal level of data which is output from the memory array 92 and outputs the amplified data to the data terminal 2b under the control of the control unit 91.

The address decoder 94 latches data which is input from the outside of the semiconductor device 900 through the address terminal 2a according to timing controlled by the control unit 91. Furthermore, the address decoder 94 decodes the latched data and selects any one of the storage blocks of the memory array 92 according to the decoded result.

The test apparatus 95 includes a management area access unit 951, a failed memory unit 952, and a function test execution unit 953.

The management area access unit 951 performs read and write operations of bad block information with respect to the management area 92b included in the memory array 92. The bad block information indicates whether there is such a failure that data cannot be correctly stored or read in or from the main storage area 92a. The failed memory unit 952 stores bad block information for each storage block included in the memory array 92 to be tested, to correspond to each storage block. Furthermore, the failed memory unit 952 includes a plurality of storage areas. The plurality of storage areas included in the failed memory unit 952 correspond to the storage blocks to be tested of the semiconductor chips 9-1 to 9-n, respectively.

The function test execution unit 953 repeatedly performs data write and read operations with respect to the main storage area 92a of each storage block based on a predetermined algorithm. Then, the function test execution unit 953 determines whether data read from the main storage area 92a of each storage block coincides with a predetermined value. Based on the determination result, the function test execution unit 953 determines whether each storage block of the memory array 92 is defective or not.

Next, the sequence of a sorting test for the semiconductor device 900 performed by an assembly maker will be described.

The sorting test is performed in three steps of (a) checking initial bad blocks, (b) performing a function test, and (c) marking bad blocks. Herein, when the bad block information stored in the management area 92b of the memory array 92 has a value of '0,' it indicates that a failure has occurred in a storage block corresponding to the management area 92b. Furthermore, when the bad block information has a value of '1,' it indicates that a failure has not occurred in the storage block corresponding to the management area 92b.

(a) Checking Initial Bad Blocks (Initial BB Check)

The management area access unit 951 outputs a read command and an address signal and sequentially reads the bad block information stored in the management area 92b of each storage block of the memory arrays 92 provided in the semiconductor chips 9-1 to 9-n. When the bad block information read from the management area 92b has a value of '0,' the management area access unit 951 stores '1' indicating a bad block in a storage area of the failed memory unit 952 corresponding to the storage block of the management area.

In this way, information indicating the bad block of the memory array 92 is stored in the failed memory unit 952.

(b) Performing Function Test

If the management area access unit 951 completes an operation for storing the information indicating the bad block in the failed memory unit 952, the function test execution unit 953 executes a function test by repeatedly performing write, erase, read and check operations with respect to the memory arrays 92 provided in the semiconductor chips 9-1 to 9-n using a predetermined algorithm. If a bad block is detected through the function test, the function test execution unit 953 stores the fact that a storage block is a bad block in the failed memory unit 952.

In addition, the function test execution unit 953 skips a function test with respect to a storage block that has already been determined as a bad block in probe inspection based on the information stored in the failed memory unit 952. Thus, the function test for the storage block having already been determined as the bad block is omitted, so that the time required for the test is shortened. As described above, omission of a process such as the function test for the storage block having already been determined as the bad block is called a bad block mask function.

(c) Marking Bad Blocks (BB Marking)

If the step of performing the function test is completed, the management area access unit 951 reads the information indicating the bad block stored in the failed memory unit 952, and writes '0' to the management area 92b of a storage block corresponding to the storage area where '1' is stored. Thus, '0' is stored in the cement area 92b of a storage block determined as a bad block in the probe inspection or the sorting test.

When the number of bad blocks stored in the failed memory unit 952 is equal to or less than a predetermined prescribed value, the management area access unit 951 determines that the semiconductor device 900 is good. When the number of bad blocks exceeds the prescribed value, the management area access unit 951 determines that the semiconductor device 900 is defective.

According to the above sequence, the test apparatus 95 performs the sorting test of the semiconductor device 900.

Figure 8A:
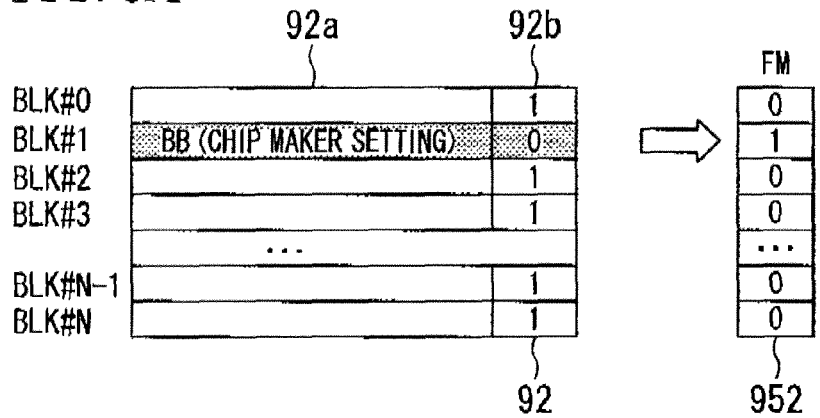
FIG. 8A is a diagram corresponding to the step of (a) checking the initial bad blocks.
Figure 8B:
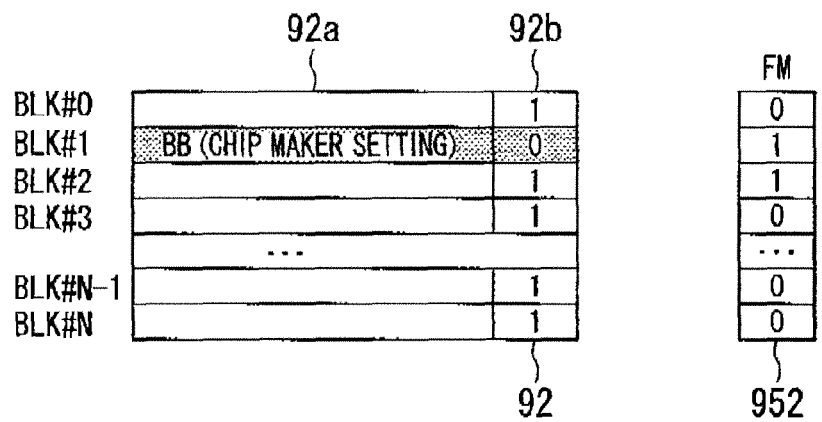
FIG. 8B is a diagram corresponding to the step of (b) performing the function test.
Figure 8C:
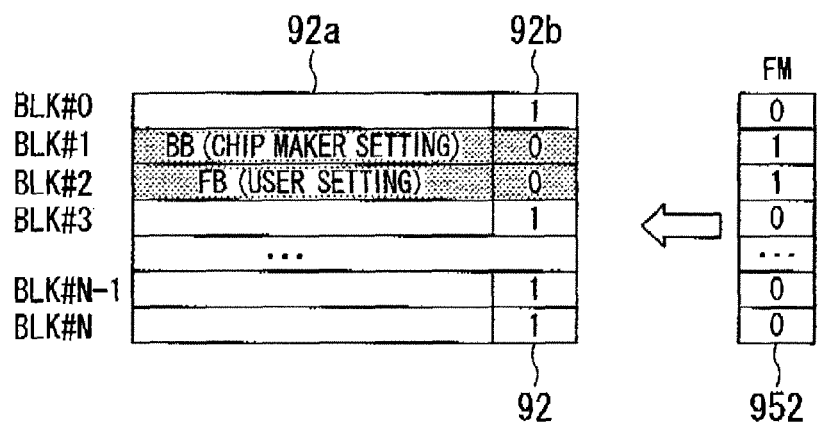
FIG. 8C is a diagram corresponding to the step of (c) marking the bad blocks.

FIGS. 8A, 8B and 8C are schematic diagrams illustrating an example of the storage states of the memory array 92 and the failed memory unit 952 in the above-described sorting test. Herein, a case where the semiconductor chip 9-1 is subjected to the sorting test and '0' indicating a bad block is stored only in the management area 92b of the storage block (BLK#1) of the memory array 92 will be described.

FIG. 8A is a diagram corresponding to the step of (a) checking the initial bad blocks.

The management area access unit 951 reads bad block information from the management area 92b of each storage block included in the memory array 92 and stores the fact that only the storage block BLK#1 is a bad block in the failed memory unit 952.

FIG. 8B is a diagram corresponding to the step of (b) performing the function test.

The function test execution unit 953 performs the function test with respect to the storage blocks BLK#0 and BLK#2 to BLK#N. The function test of the storage block BLK#1 is omitted by the bad block mask function. When it is determined that the function block BLK#2 is a bad block by the function test, '1' is stored in a storage area of the failed memory unit 952 corresponding to the storage block BLK#2.

FIG. 8C is a diagram corresponding to the step of (c) marking the bad blocks.

The management area access unit 951 writes '0' indicating the bad block to the management areas 92b of the storage blocks BLK#1 and BLK#2 corresponding to the storage areas having a value of '1' of the failed memory unit 952. When the number (2) of bad blocks stored in the failed memory unit 952 is equal to or less than the prescribed value, the management area access unit 951 determines that the semiconductor device 900 subjected to the sorting test is good. On the other hand, when the number of bad blocks exceeds the prescribed value, the management area access unit 951 determines that the semiconductor device 900 subjected to the sorting test is defective.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a first management area storing a plurality of inspection results. The plurality of inspection results are obtained by executing inspections for each of a plurality of storage areas which store a plurality of data. The semiconductor device may include, but is not limited to, a second management area storing the plurality of inspection results. The first and second management areas are independent from each other.

In some cases, when a first inspection of the inspections is executed, the semiconductor device stores a first inspection result of the plurality of inspection results into both the first management area and the second management area. When a second inspection of the inspections is executed after the first inspection is executed, the semiconductor device replaces the first inspection result stored in the first management area by a second inspection result being obtained by the second inspection.

In some cases, when a first inspection is executed, the semiconductor device stores a first inspection result into both the first management area and the second management area. The semiconductor device reads the first inspection result stored in the first management area and executes a second inspection based on the first inspection result stored in the first management area. The semiconductor device writes a second inspection result being obtained by the second inspection into the first management area so that the first inspection result stored in the first management area is replaced by the second inspection result.

In some cases, when a third inspection is executed after the second inspection is executed, the semiconductor device reads the first inspection result stored in the second management area and executes the third inspection based on the first inspection result stored in the second management area and writes a third inspection result being obtained by the third inspection into the first management area so that the second inspection result stored in the first management area is replaced by the third inspection result.

In some cases, when a third inspection is executed after the second inspection is executed, the semiconductor device reads the first inspection result stored in the second management area, the semiconductor device replaces the second inspection result stored in the first management area by the first inspection result in the second management area so that the first management area is restored to the first inspection result from the second inspection result.

In some cases, when the third inspection is executed, the semiconductor device replaces the first inspection result restored in the first management area by a third inspection result.

In some cases, when a first inspection is executed, the semiconductor device writes a first inspection result being obtained by the first inspection into at least the second management area. When a second inspection is executed after the first inspection is executed, the semiconductor device writes a second inspection result being obtained by the second inspection into the first management area. The second inspection result is different from the first inspection result. When a third inspection is executed after the second inspection is executed, the semiconductor device reads the first inspection result stored in the second management area and executes the third inspection based on the first inspection result stored in the second management area and replaces the second inspection result stored in the first management area by a third inspection result being obtained by the third inspection so that the first management area is replaced by the third inspection result from the second inspection result.

In some cases, the semiconductor device replaces the second inspection result stored in the first management area by the first inspection result read from the second management area. The semiconductor device reads the first inspection result from the first management area instead of reading the first inspection result from the second management area. The semiconductor device executes a third inspection based on the first inspection result stored in the first management area. The semiconductor device writes a third inspection result of the third inspection into the first management area, so that the first management area is rewritten with the third inspection result from the second inspection result via the first inspection result.

In some cases, the semiconductor device further includes a plurality of first management areas corresponding to the plurality of storage areas and a plurality of second management areas corresponding to the plurality of storage areas. In this case, the semiconductor device stores the plurality of first inspection results respectively corresponding to the plurality of storage areas into at least the plurality of second management areas.

In some cases, when a second inspection is executed after the first inspection is executed, the semiconductor device stores the plurality of second inspection results respectively corresponding to the plurality of storage areas into the plurality of first management areas. The plurality of second inspection results of the plurality of second management area are different from the plurality of first inspection results respectively. The plurality of second inspection results correspond to the plurality of storage areas associated with the second inspection respectively.

In some cases, when a third inspection is executed after the second inspection is executed, the semiconductor device reads the plurality of first inspection results stored in the plurality of second management area, and the semiconductor device writes a plurality of third inspection results of the third inspection associated with the plurality of storage areas into the plurality of first management areas, so that the plurality of second inspection results respectively stored in the plurality of first management areas are replaced by the plurality of third inspection results respectively.

In some cases, when a third inspection is executed after the second inspection is executed, the semiconductor device reads the plurality of first inspection results stored in the plurality of second management areas, and the semiconductor device replaces the plurality of second inspection results stored in the plurality of first management areas by the plurality of first inspection results of the plurality of second management areas, so that the plurality of first management areas is restored with the plurality of first inspection results from the plurality of second inspection results.

In some cases, when the third inspection is executed, the semiconductor device replaces the plurality of first inspection results restored in the plurality of first management areas by a plurality of third inspection results corresponding to the third inspection associated with the plurality of storage areas.

In some cases, the semiconductor device includes each of the pluralities of first management areas and second management areas including a memory element storing one bit of the plurality of inspection results.

In some cases, the semiconductor device includes the plurality of storage areas which includes a plurality of data memory elements, and each of the data memory elements and the memory element have a substantively identical structure.

In some cases, the semiconductor device includes the first inspection corresponding to a pre-processing test of a semiconductor wafer and the second inspection corresponding to a post-processing test to be executed after a packaging process is performed respectively for a plurality of chips that are separated from the semiconductor wafer.

In some cases, the semiconductor device includes the first inspection corresponding to a pre-processing test of a semiconductor wafer, and the second inspection corresponding to a post-processing test to be executed after a packaging process is performed for a chip which is included a plurality of chips which is obtained from the semiconductor wafer.

In another embodiment, a semiconductor device may include, but is not limited to a plurality of main storage areas storing data, and a plurality of first management areas corresponding to the plurality of main storage areas respectively. The plurality of first management areas store a plurality of failure information indicating whether the plurality of main storage areas are failure areas or non-failure areas. The semiconductor device may include a plurality of second management areas respectively indicating whether the plurality of main storage areas are failure areas or non-failure areas. The plurality of second management areas correspond to the plurality of main storage areas respectively, wherein the plurality of first management areas respectively store a plurality of failure information formed by respectively merging a plurality of first inspection results and a plurality of second inspection results. The plurality of first inspection results are obtained by executing a first inspection, the plurality of second inspection results are obtained by executing a second inspection after the first inspection is executed, and the plurality of second management areas respectively store the first inspection results without storing the second inspection results.

In some cases, the semiconductor device includes each of the pluralities of first management areas and second management areas including a memory element storing one bit of the plurality of failure information.

In some cases, the semiconductor device includes the plurality of storage areas including a plurality of data memory elements, in which each of the plurality of data memory elements and the memory element have a substantively identical structure.

In some cases, for the semiconductor device, when the second inspection is executed again, the second inspection is re-executed based on the plurality of failure information stored in the plurality of second management areas to obtain a second plurality of second inspection results, and the second plurality of second inspection results and the plurality of first inspection results are memorized respectively into the plurality of first management areas.

In some cases, for the semiconductor device, when the second inspection is executed again, the plurality of failure information in the plurality of second management areas are respectively stored into the plurality of first management areas. The second inspection is re-executed to obtain a second plurality of second inspection results based on the plurality of failure information respectively stored in the plurality of first management areas, and the second plurality of second inspection results and the plurality of first inspection results are memorized respectively into the plurality of first management areas.

In some cases, for the semiconductor device, the second inspection is executed to a plurality of first non-failure areas in the plurality of main storage areas. The plurality of first non-failure areas are respectively determined to be non-failure areas by the first inspection is executed. When the plurality of first non-failure areas is determined to be a failure area by the second inspection is executed, a plurality of failure information is stored into the plurality of the first management areas corresponding to the plurality of main storage areas.

In some cases, for the semiconductor device, the first inspection corresponds to a pre-processing test of a semiconductor wafer, and the second inspection corresponds to a post-processing test being executed after a packaging process is performed respectively for a plurality of chips that are separated from the semiconductor wafer.

In still another embodiment, a semiconductor test method may include, but is not limited to, testing a first inspection with a plurality of storage areas. The first inspection results a plurality of first inspection results. The plurality of storage areas store a plurality of data. The semiconductor test method includes storing the plurality of first inspection results into at least a plurality of second management areas among a plurality of first management areas and the plurality of second management areas corresponding to the plurality of storage areas. The semiconductor test method includes reading the plurality of first inspection results from the plurality of second management areas, and testing a second inspection after the first inspection is executed. The second inspection is executed to a plurality of non-failure areas in the plurality of storage areas based on the plurality of first inspection results of the second management areas. The first inspection results indicate whether the plurality of storage areas are non-failure areas or failure areas. The semiconductor test method includes storing a plurality of second inspection results that indicate the second inspection respectively corresponding to the plurality of non-failure areas of the plurality of storage area into the plurality of first management areas.

In some cases, the semiconductor test method further includes re-reading the plurality of first inspection results as a second plurality of first inspection results from the plurality of second management areas after the second inspection is executed, testing a third inspection after the second inspection is executed to the plurality of storage areas corresponding to the plurality of non-failure areas based on the second plurality of first inspection results and causing a plurality of third inspection results; and storing the plurality of third inspection results respectively corresponding to the plurality of storage areas into the plurality of first management areas.

In some cases, for the semiconductor test method, when the first inspection is executed, the plurality of first inspection results is stored into both the plurality of first management areas and the plurality of second management areas.

In some cases, for the semiconductor test method, when a third inspection is executed after the second inspection is executed, the plurality of first inspection results read from the plurality of second management areas, the plurality of first inspection results of the plurality of second management areas is re-stored into the plurality of first management areas which the plurality of second inspection results has been stored, so that the plurality of second inspection results stored in the plurality of first management areas is replaced by the plurality of first inspection results.

In some cases, the semiconductor test method includes executing the third inspection which comprises verifying the plurality of first inspection results re-stored in the plurality of first management areas and the first inspection results stored in the plurality of second management areas.

In some cases, when the third inspection is executed, the semiconductor test method further includes reading the plurality of first inspection results respectively from the plurality of first management areas instead of reading the plurality of first inspection results respectively from the plurality of second management areas, testing the third inspection to each of the plurality of storage areas respectively corresponding to the non-failure area based on the plurality of first inspection results of the plurality of first management areas; and storing the plurality of third inspection results respectively corresponding to the plurality of storage areas having been executed by the third inspection into the plurality of first management areas.

In some cases, for the semiconductor test method, skipping the second inspection to a test of the plurality of storage areas where the plurality of first inspection results indicate the failure areas of the plurality of storage areas.

In some cases, for the semiconductor test method, skipping the third inspection to a test of the plurality of storage areas where the plurality of first inspection results indicate the failure areas of the plurality of storage areas.

In the current descriptions, testing may be referred to as performing, which may be used to perform an inspection for storage areas or other areas relating to memory elements or memory area where data are stored.

Meanwhile, the semiconductor device 900 determined to be defective in the sorting test is not shipped. However, in the sorting test, for example, when a connection failure has occurred between the terminals (pins) 2a to 2c of the semiconductor device 900 and sockets of the test apparatus 95, since the sorting test is not correctly performed, the semiconductor device 900 may be erroneously determined to be defective.

In this regard, it is considered that the semiconductor device 900 determined to be defective is not discarded and is mounted on a different test apparatus 95 or remounted on the test apparatus 95, and the sorting test is performed again. Consequently, the semiconductor device 900, which is originally good, can be prevented from being erroneously determined to be defective due to a connection failure between the semiconductor device 900 and the test apparatus 95 and discarded, and the number of semiconductor devices 900 to be wastefully discarded can be reduced.

Herein, when the sorting test is performed again, it is not preferable to perform the sorting test again based on the bad block information of the management area 92b in which information different from the result of the probe inspection might be written. In this regard, it is considered to perform the sorting test again after erasing the bad block information stored in the management area 92b.

However, if the bad block information stored in the management area 92b is erased, since the result of the probe inspection is also erased, the bad block mask function of the test apparatus 95 cannot be used, and all storage blocks are subjected to the sorting test, causing an increase in the time required for the sorting test.

Hereinafter, embodiments of the present invention will be described in detail with reference to the drawings.

In the following, a semiconductor device and a test method thereof according to an embodiment of the present invention will be described with reference to the accompanying drawings.

Figure 1:
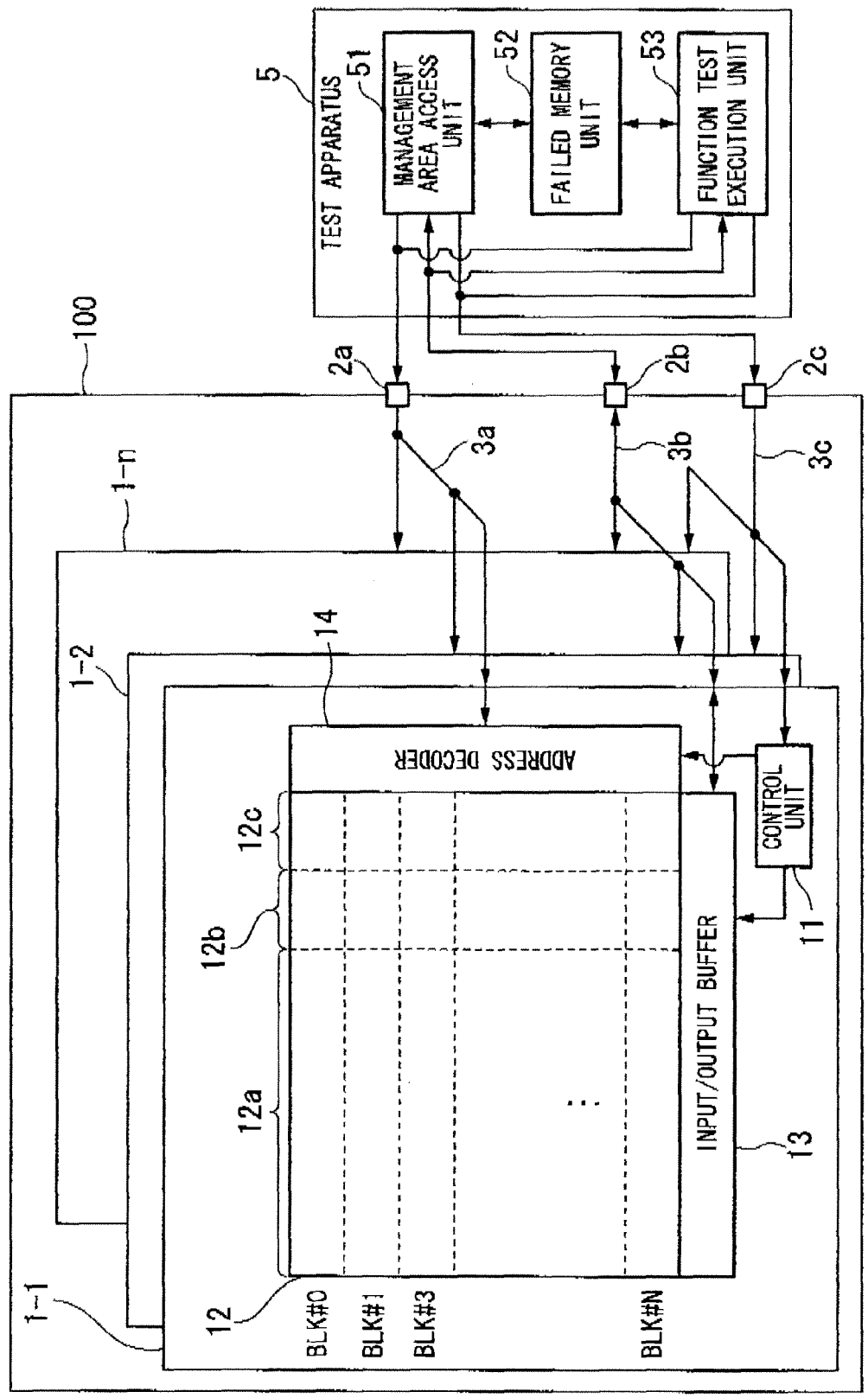
FIG. 1 is a schematic block diagram illustrating the configuration of a semiconductor device and a test apparatus used for a sorting test of the semiconductor device.

FIG. 1 is a schematic block diagram illustrating the configuration of a semiconductor device 100 and a test apparatus 5 used for a sorting test of the semiconductor device 100 in the present embodiment. The semiconductor device 100 is obtained by performing MCP mounting with respect to a plurality of semiconductor chips 1-1 to 1-n (n is a natural number). For example, the semiconductor chips 1-1 to 1-n are chips of non-volatile memories such as NAND type flash memories.

Furthermore, the semiconductor device 100 includes the semiconductor chips 1-1 to 1-n having non-volatile memory elements, an address terminal 2a, a data terminal 2b, a control terminal 2c, connection wirings 3a for connecting the semiconductor chips 1-1 to 1-n to the address terminal 2a, connection wirings 3b for connecting the semiconductor chips 1-1 to 1-n to the data terminal 2b, and connection wirings 3c for connecting the semiconductor chips 1-1 to 1-n to the control terminal 2c.

Each of the semiconductor chips 1-1 to 1-n has the same configuration and includes a control unit 11, a memory array 12, an input/output buffer 13, and an address decoder 14.

The control unit 11 controls the input/output buffer 13 and the address decoder 14 in response to a control command which is input from the outside through the control terminal 2c. Furthermore, the control unit 11 switches a normal mode and a test mode in response to the input control command. Herein, the control command, for example, includes a read command, a write command, a command for switching the normal mode and the test mode, and the like.

The memory array 12 has a plurality of storage blocks BLK#0 to BLK#N (N is a natural number) including non-volatile memory elements. Each storage block includes a main storage area 12a for storing data which is input from the data terminal 2b via the input/output buffer 13, and a first management area 12b and a second management area 12c for storing bad block information indicating whether a failure has occurred or not in the main storage area 12a. Bad block information based on the result of probe inspection (a pre-processing test) performed before the shipment of the semiconductor chips 1-1 to 1-n is stored in the first management area 12b and the second management area 12c of a storage block. The bad block information indicates whether a failure has occurred or not in the main storage area 12a of the storage block. In the present embodiment, when the bad block information has a value of '1,' it indicates that a failure has not occurred, and when the bad block information has a value of '0,' it indicates that a failure has occurred. In other words, the value of '1' indicates that a defective block exists in the main storage area 12a of the storage block. The value of '0' indicates that any defective block does not exist in the main storage area 12a of the storage block.

Therefore, the semiconductor device 100 includes the first management area 12a storing a plurality of inspection results. The plurality of inspection results is obtained by executing inspections for each of a plurality of storage areas which store a plurality of data. The second management area 12c storing the plurality of inspection results, the first and second management areas being independent from each other.

'0' is stored in the first management area 12b and the second management area 12c of a storage block determined as a bad block in the probe inspection. Meanwhile, '1' is stored in the first management area 12b and the second management area 12c of a storage block not determined as a bad block. Furthermore, the result of a sorting test, which will be described later, is stored in the first management area 12b. The first management area 12b of each storage block is referred to when a bad block is replaced with a prepared redundant storage block.

In some cases, the semiconductor device includes each of the pluralities of first management areas and second management areas including a memory element storing one bit of the plurality of inspection results.

Further, in some cases, the semiconductor device includes a plurality of storage areas including a plurality of data memory elements. In this case, each of the plurality of data memory elements and the memory element have an identical structure.

The address decoder 14 latches an address signal which is input from the outside of the semiconductor device 100 through the address terminal 2a under the control of the control unit 11. Furthermore, the address decoder 14 decodes the latched address signal and selects any one of the storage blocks of the memory array 12 according to the decoding result.

Under the control of the control unit 11, the input/output buffer 13 switches a write operation for amplifying a signal level of data which is input from the data terminal 2b and outputting the amplified data to the memory array 12 with respect to the storage block selected by the address decoder 14 and a read operation for amplifying a signal level of data which is output from the memory array 12 selected by the address decoder 14 and outputting the amplified data to the data terminal 2b.

The test apparatus 5 performs a sorting test with respect to the semiconductor device 100 obtained by performing MCP mounting with respect to the semiconductor chips 1-1 to 1-n having the above configuration, respectively. Furthermore, the test apparatus 5 includes a management area access unit 51, a failed memory unit 52, and a function test execution unit 53. The management area access unit 51 performs read and write operations of bad block information with respect to the first management area 12b and the second management area 12c included in the memory array 12. The failed memory unit 52 stores whether each storage block included in the memory array 12 provided in a semiconductor device subjected to the sorting test is defective or not Furthermore, the failed memory unit 52 includes a plurality of storage areas corresponding to the storage blocks to be tested of the semiconductor chips 1-1 to 1-n.

The function test execution unit 53 repeatedly performs data write and read operations with respect to each storage block of the main storage area 12a based on a predetermined algorithm, and determines whether data read from the storage block of the main storage area 12a coincides with a predetermined value. Based on the determination result, the function test execution unit 53 determines whether a defective bad block exists or not in the main storage area 12a of the memory array 12.

Next, the sequence of a sorting test and the sequence of a resorting test performed for the MCP-mounted semiconductor device 100 in the present embodiment will be described.

The sorting test is performed in three steps of (1) checking initial bad blocks, (2) performing a function test, and (3) marking failed blocks.

The resorting test performed based on the result of the sorting test is performed in five steps of (4) checking bad blocks, (5) restoring bad blocks, (6) checking initial bad blocks, (1) performing a function test, and (8) marking failed blocks. In addition, since the three steps (6) to (8) are the same as the steps (1) to (3) in the sorting test in terms of processing, a description thereof will be omitted.

In some cases, a semiconductor device (100) may include, but is not limited to, a first management area (12b) storing a plurality of inspection results. The plurality of inspection results are obtained by executing inspections for each of a plurality of storage areas (12a) which store a plurality of data. The semiconductor device may include, but is not limited to, a second management area (12c) storing the plurality of inspection results. The first and second management areas are independent from each other.

In some cases, a semiconductor device may include, but is not limited to, a plurality of main storage areas storing data (12a), and a plurality of first management areas (12b) corresponding to the plurality of main storage areas respectively. The plurality of first management areas store a plurality of failure information indicating whether the plurality of main storage areas are failure areas or non-failure areas. The semiconductor device may include a plurality of second management areas (12c) respectively indicating whether the plurality of main storage areas are failure areas or non-failure areas. The plurality of second management areas correspond to the plurality of main storage areas respectively, wherein the plurality of first management areas respectively store a plurality of failure information formed by respectively merging a plurality of first inspection results and a plurality of second inspection results. The plurality of second inspection results are obtained by executing the first inspection, and the plurality of second management areas respectively store the first inspection results without storing the second inspection results.

In some cases, a semiconductor test method may include, but is not limited to, performing a first inspection for a plurality of storage areas as test. The first inspection results a plurality of first inspection results. The plurality of storage areas store a plurality of data. The semiconductor test method includes storing the plurality of first inspection results into at least a plurality of second management areas, wherein there are a plurality of first management areas and the plurality of second management areas. The plurality of first management areas and the plurality of second management areas respectively correspond to the plurality of storage areas. The semiconductor test method includes reading the plurality of first inspection results from the plurality of second management areas, and performing a second inspection as test after the first inspection is executed. The second inspection is executed for a plurality of non-failure areas in the plurality of storage areas based on the plurality of first inspection results which indicate whether the plurality of storage areas are non-failure areas or failure areas, The semiconductor test method includes storing the plurality of second inspection results respectively corresponding to the plurality of non-failure areas of the plurality of storage area into the plurality of first management areas.

(1) Checking Initial Bad Blocks (Initial BB Check)

The management area access unit 51 outputs a read command and an address signal, to the semiconductor device 100 and sequentially reads bad block information stored in the first management areas 12*b* of the semiconductor chips 1-1 to 1-*n* provided in the semiconductor device 100.

When the bad block information read from the management area 12*b* has a value of '0' indicating a bad block, the management area access unit 51 stores '1' in a storage area of the failed memory unit 52 corresponding to the block of the first management area 12*b* having the bad block information, Thus, the failed memory unit 52 marks whether any of the storage blocks of the memory array 12 is a bad block. That is, the management area access unit 51 reads the bad block information based on the result of the probe inspection performed by a chip maker from the first management area 12*b*, and stores information indicating a bad block in the failed memory unit 52 of the test apparatus 5. In addition, '0' is stored in the rest of storage areas of the failed memory unit 52 as an initial value.

(2) Performing Function Test

When, the step of (1) checking initial bad blocks is completed, the function test execution unit 53 executes a function test by repeatedly performing write, erase, read and check operations with respect to each storage block of the memory arrays 12 provided in the semiconductor chips 1-1 to 1-*n* using a predetermined algorithm.

If a failed block is detected through the function test, the function test execution unit 53 writes '1' to a storage area of the failed memory unit 52 corresponding to the failed block. Thus, the fact that the corresponding storage block is a failed block is stored in the failed memory unit 52. In addition, when performing the function test, the function test execution unit 53 shortens the time required for the sorting test using a bad block mask function of skipping a test for the storage block, which is already stored in the failed memory unit 52 as a bad block.

(3) Marking Failed Blocks (FB Marking)

When (2) the function test is completed, the management area access unit 51 reads the information stored in the failed memory unit 52, and writes '0' to the first management area 12*b* of a storage block corresponding to the storage area where '1' is stored.

Furthermore, when the number of bad blocks and failed blocks stored in the failed memory unit 52 is equal to or less than a predetermined prescribed value, the management area access unit 51 determines that the semiconductor device 100 subjected to the sorting test is good. When the number of bad blocks and failed blocks exceeds the prescribed value, the management area access unit 51 determines that the semiconductor device 100 is defective.

In addition, when the sum of the number of bad blocks and the number of failed blocks exceeds a predetermined reinspection condition value, the management area access unit 51 determines the semiconductor device 100 subjected to the sorting test to be subjected to the sorting test (resorting test) again. The reinspection condition value is predetermined from statistical information and the like in the sorting test based on an expectation value and the like of the number of detected bad blocks and failed blocks. For example, the number of bad blocks and failed blocks, which is not statistically detected, or the number of bad blocks and failed blocks having a significant low detection probability, is used as the reinspection condition value.

When the number of bad blocks and failed blocks stored in the memory array 12 exceeds the reinspection condition value, since it is probable that the semiconductor device 100 will be determined to be defective due to factors other than the semiconductor device 100, the semiconductor device 100 is determined to be subjected to the sorting test (resorting test) again.

The test apparatus 5 performs the sorting test with respect to the semiconductor device 100 by sequentially performing the above-described steps (1) to (3).

In addition, in the step of (3) marking the failed blocks, in order to check whether bad block information has been correctly written to the first management area 12*b*, after the bad block information is written to the first management area 12*b*, the management area access unit 51 may read the bad block information from the first management area 12*b* and detect whether the read bad block information coincides with the written bad block information. Furthermore, the management area access unit 51 may determine the semiconductor device 100 to be defective or to be subjected to the resorting test based on the amount of non-coinciding bad block information.

Next, the resorting test, which is performed for the semiconductor device 100 determined to be subjected to the resorting test in the sorting test, will be described.

The resorting test is performed by a test apparatus 5 different from the test apparatus 5 used in the sorting test, or is performed after the semiconductor device 100 is remounted on the test apparatus 5. This is for preventing the semiconductor device 100 having been subjected to the resorting test from being determined to be defective or to be subjected to the sorting test again due to factors other than the semiconductor device 100 in the resorting test.

For example, when starting the sorting test, although the test apparatus 5 can perform data write and read operations with respect to the semiconductor device 100, the test apparatus 5 may not perform the data write and read operations while performing the sorting test. This may occur when a connection between the terminals (pins) 2a to 2c of the semiconductor device 100 and sockets of the test apparatus 5 is electrically unstable. When the sorting test is performed in such a state, since the step of (2) performing the function test cannot be correctly performed, the semiconductor device 100 is determined to be defective. In such a case, it is highly probable that a semiconductor device 100 which is originally good will be included in the semiconductor devices 100 determined to be defective. Furthermore, the number of detected failed blocks is also significantly increased.

In such a case, if the semiconductor device 100 is remounted on the test apparatus 5, the connection between the terminals (pins) 2a to 2c of the semiconductor device 100 and the sockets of the test apparatus 5 may be electrically stable. In this regard, performing the resorting test using a different test apparatus 5 or performing the resorting test after remounting the semiconductor device 100 is effective for preventing the semiconductor device 100 from being determined to be defective again due to the factors other than the semiconductor device 100.

Furthermore, when a failure has occurred in the test apparatus 5, the resorting test is performed using the different test apparatus 5, so that the resorting test can be correctly performed.

The resorting test is performed by the test apparatus 5 through the steps (4) to (8).

(4) Checking Bad Blocks (BB Check)

The management area access unit 51 outputs a read command and an address signal to the semiconductor device 100 and sequentially reads bad block information stored in the second management areas 12c of the semiconductor chips 1-1 to 1-n provided in the semiconductor device 100.

When the bad block information read from the second management area 12c has a value of '0,' the management area access unit 51 stores '1' in a storage area of the failed memory unit 52 corresponding to the storage block of the second management area 12c. Thus, bad block information based on the result of the probe inspection (that is, inspection by a chip maker) for the semiconductor device 100 subjected to the resorting test is stored in the failed memory unit 52.

(5) Restoring Bad Blocks (Initial Erase)

When the step of (4) checking bad blocks is completed, the management area access unit 51 performs a process of reading the information stored in the failed memory unit 52 and writing '0' in a storage block of the first management area 12b corresponding to the storage area where '1' is stored with respect to the memory arrays 12 of the semiconductor chips 1-1 to 1-n of the semiconductor device 100. Thus, the information stored in the first management area 12b of the memory arrays 12 of the semiconductor chips 1-1 to 1-n is returned to the state written in the probe inspection. That is, the bad block information stored in the second management area 12c based on the result of the probe inspection is copied into the first management area 12b, so that the bad block information based on the result of the probe inspection is overwritten on the bad block information, which is stored in the first management area 12b based on the result of the sorting test, for restoration.

In addition, after restoring the bad block information of the first management area 12b, the management area access unit 51 may read the bad block information from the first management area 12b and determine whether the restoration of the bad block information has been correctly performed by comparing the read bad block information with the written bad block information. At this time, the management area access unit 51 detects the amount of non-coinciding bad block information. When the detected amount exceeds a prescribed value, the management area access unit 51 may also determine the semiconductor device 100 subjected to the resorting test to be defective. In addition, when the detected amount exceeds a reinspection condition value, the management area access unit 51 may complete the resorting test for the semiconductor device 100 and set the semiconductor device 100 to be subjected to the resorting test again.

Hereinafter, an example of the sorting test and the resorting test in the present embodiment and the sequence thereof will be described with reference to FIGS. 2A, 2B, 2C, 3A, 3B, 3C, 4, 5A, 5B, 5C, 6A, and 6B.

Herein, a case where a connection between the semiconductor device 100 and the test apparatus 5 is electrically stable in the sorting test and a case where the connection between the semiconductor device 100 and the test apparatus 5 is electrically unstable and data write and read operations cannot be performed in the process of the sorting test will be described as an example. Next, an example of the resorting test will be described.

Furthermore, in an example described below, the number of storage blocks of the memory array 12 is set to 1024 (N=1023), the prescribed value is set to 40, and the reinspection condition value is set to 512. In addition, among the storage blocks BLK#0 to BLK#1023 of the memory array 12, the storage block BLK#1 is determined as a bad block in the probe inspection, and thus '0' is stored in advance in the first management area 12b and the second management area 12c of the storage block BLK#1.

Figure 2A:
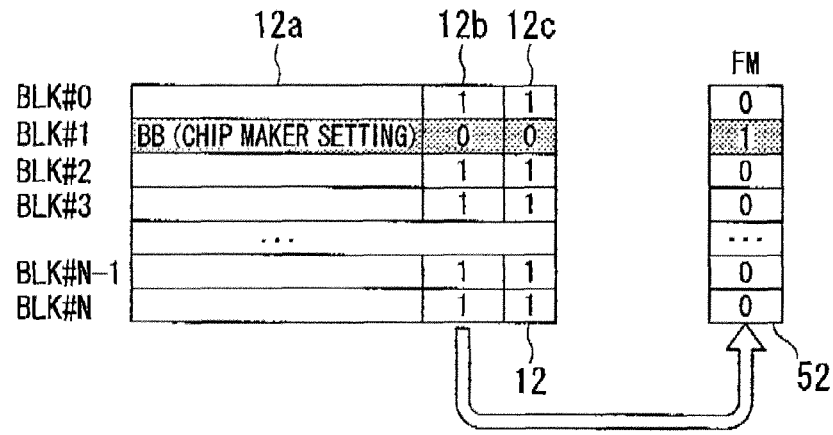
FIGS. 2A, 2B and 2C are diagrams illustrating an example of the process of the sorting test when the connection between the semiconductor device and the test apparatus is electrically stable in the present embodiment.
Figure 2B:
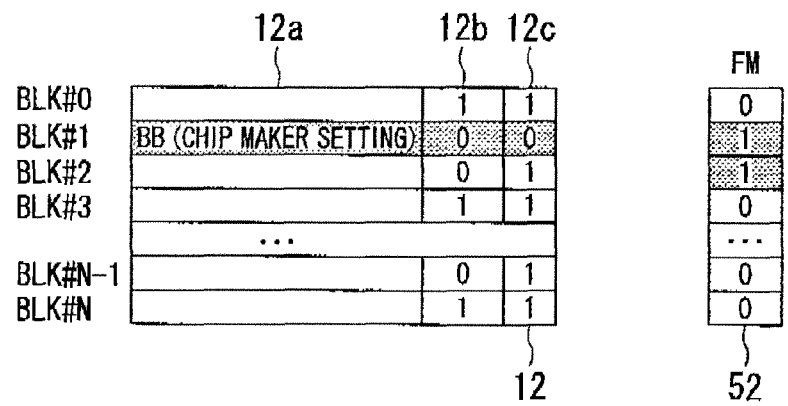
Figure 2C:
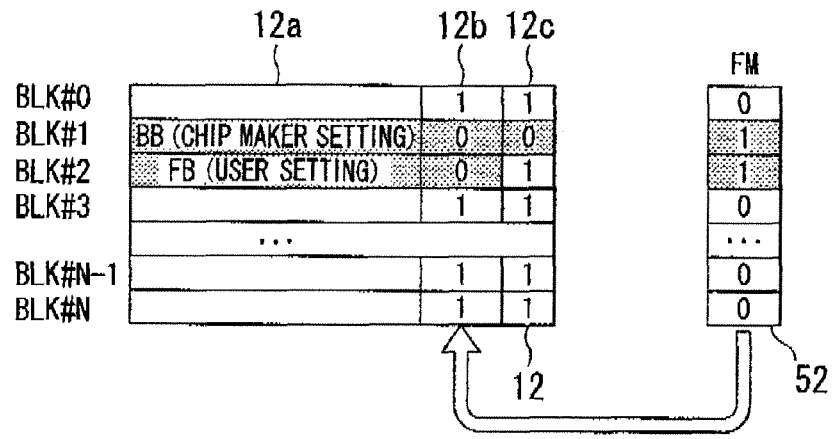

FIGS. 2A, 2B and 2C are diagrams illustrating an example of the process of the sorting test when the connection between the semiconductor device 100 and the test apparatus 5 is electrically stable in the present embodiment. FIGS. 2A, 2B and 2C illustrate the storage states of the memory array 12 and the failed memory unit 52 in the process of the sorting test.

FIG. 2A is a diagram corresponding to the step of (1) checking initial bad blocks.

The management area access unit 51 stores the fact that the storage block BLK#1 is a bad block in the failed memory unit 52 based on the bad block information stored in the first management area 12b of the memory array 12. Thus, '1' is stored in a storage area of the failed memory unit 52 corresponding to the storage block BLK#1.

FIG. 2B is a diagram corresponding to the step of (2) performing the function test.

When bad blocks are completely marked in the failed memory unit 52, the function test execution unit 53 performs the function test with respect to each storage block of the memory array 12 based on a predetermined algorithm. As a result, if it is detected that a failure has occurred only in the storage block BLK#2 through the function test, the function test execution unit 53 stores '1' indicating a failed block in a storage area of the failed memory unit 52 corresponding to the storage block BLK#2. In addition, since the function test is also normally performed with respect to the first management area, the data of the first management area 12b of each block BLK may be '1' or '0' by reflecting the result of the function test. Meanwhile, since the function test is not performed with respect to the second management area 12c, data thereof has an initial value (i.e., data set by a chip maker).

FIG. 2C is a diagram corresponding to the step of (3) marking bad blocks.

When the function test by the function test execution unit 53 is completed, the management area access unit 51 stores '0' in the function block BLK#2 of the first management area 12b based on the information stored in the failed memory unit

52. Thus, bad block information indicating the bad block detected in the probe inspection and the failed block detected in the sorting test is stored in the first management area 12*b* of the memory array 12. In addition, the function test execution unit 53 may also write '0' to the bad block BLK#1 of the first management area 12*b*.

At this time, since the number of bad blocks stored in the failed memory unit 52 is 2 and equal to or less than the prescribed value '40,' the management area access unit 51 determines that the semiconductor device 100 subjected to the sorting test is good.

Next, the case where the connection between the semiconductor device 100 and the test apparatus 5 is electrically unstable and data write and read operations cannot be performed in the process of the sorting test will be described with reference to FIGS. 3A, 3B, 3C and 4. Herein, since the connection is electrically unstable, an example in which the following event occurs will be described.

In the sorting test described below, when starting the sorting test, data write and read operations may be performed. However, while the test is being performed with respect to the storage blocks (BLK#3 to BLK#1022) in (2) the function test, the data write and read operations cannot be correctly performed, and then can be performed with respect to the storage block BLK#1023. Furthermore, even in (3) marking of the bad blocks, data cannot be correctly written in some storage blocks.

FIGS. 3A, 3B, 3C and 4 are diagrams illustrating an example of the process of the sorting test when the connection between the semiconductor device 100 and the test apparatus 5 is electrically unstable in the present embodiment. FIGS. 3A, 3B, 3C and 4 illustrate the storage states of the memory array 12 and the failed memory unit 52 in the process of the sorting test.

Figure 3A:
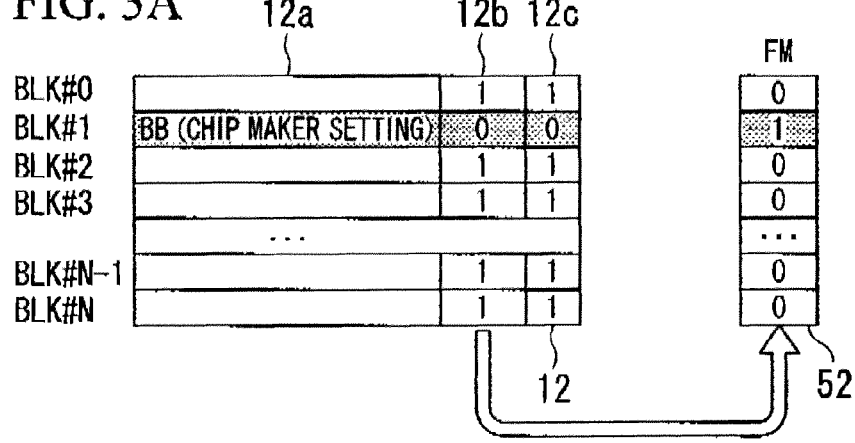
FIGS. 3A, 3B, and 3C are diagrams illustrating an example of the process of the sorting test when the connection between the semiconductor device and the test apparatus is electrically unstable in the present embodiment.

FIG. 3A is a diagram corresponding to the step of (1) checking initial bad blocks.

Similarly to the example illustrated in FIG. 2A, the management area access unit 51 stores the fact that the storage block BLK#1 is a bad block in the failed memory unit 52 based on the bad block information stored in the first management area 12*b*.

Figure 3B:
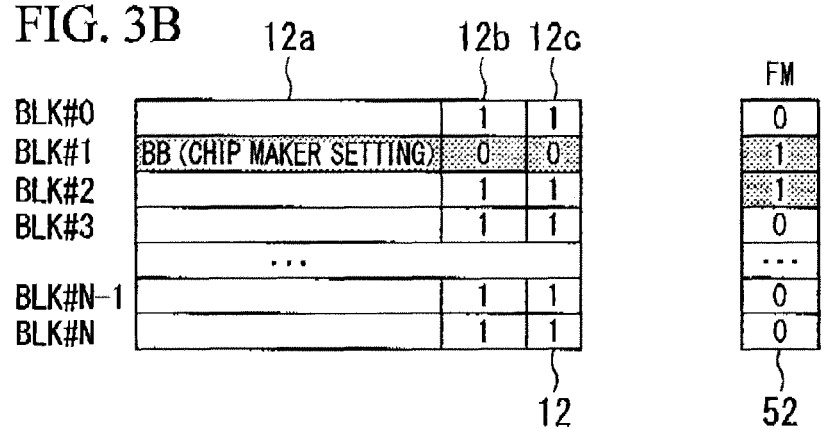

FIG. 3B is a diagram illustrating the storage state of the failed memory unit 52 when the function test has been completed for the storage blocks BLK#0 and BLK#2 (the BLK#1 is skipped as mentioned above) in the step of (2) performing the function test.

The function test execution unit 53 skips the function test for the storage block (BLK#1) by the bad block mask function and sequentially performs the function test with respect to each block from the storage block BLK#0. If the storage block BLK#2 is detected as a failed block in the test, the function test execution unit 53 stores '1' in a storage area of the failed memory unit 52 corresponding to the storage block BLK#2.

Figure 3C:
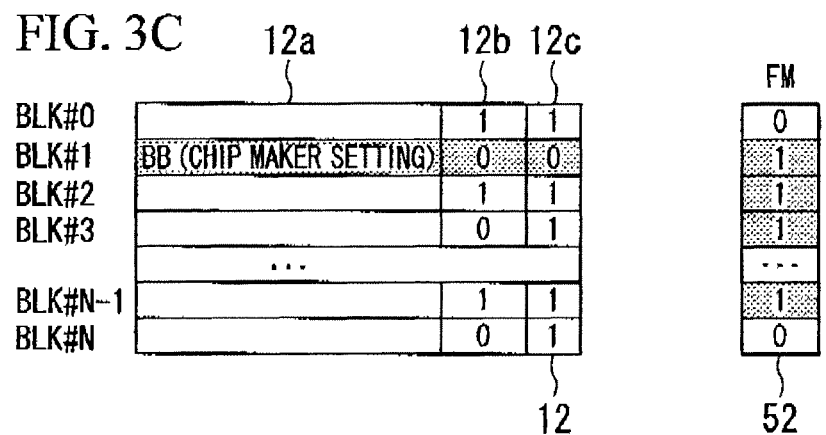

FIG. 3C is a diagram illustrating the storage state of the failed memory unit 52 when the function test has been completed for the remaining storage blocks BLK#0 to BLK#1023 in the function test.

The function test execution unit 53 sequentially performs the function test with respect to the storage blocks BLK#3 to BLK#1023. At this time, the function test execution unit 53 cannot correctly perform the data write and read operations with respect to the memory array 12 of the semiconductor device 100 because the electrical connection between the semiconductor device 100 and the test apparatus 5 is unstable. Therefore, the function test execution unit 53 assumes that a failure has occurred in the storage blocks BLK#3 to BLK#1022 and determines that the storage blocks BLK#3 to BLK#1022 are failed blocks. As a result, the function test execution unit 53 stores '1' indicating a failed block in storage areas of the failed memory unit 52 corresponding to the storage blocks BLK#3 to BLK#1022. In addition, data based on the function test is stored in the first management area 12*b* as mentioned above.

Then, the function test execution unit 53 performs the function test on with respect to the storage block BLK#1023. At this time, if the data read and write operations are correctly performed with respect to the memory arrays 12 of the semiconductor device 100 and the corresponding storage block is normal, it means that the storage block BLK#1023 passes the function test performed by the function test execution unit 53. As a result, as illustrated in FIG. 3C, '0' is stored in storage areas of the failed memory unit 52 corresponding to the storage blocks BLK#0 and BLK#1023 and '1' is stored in storage areas of the failed memory unit 52 corresponding to the storage blocks BLK#1 to BLK#1022.

Figure 4:
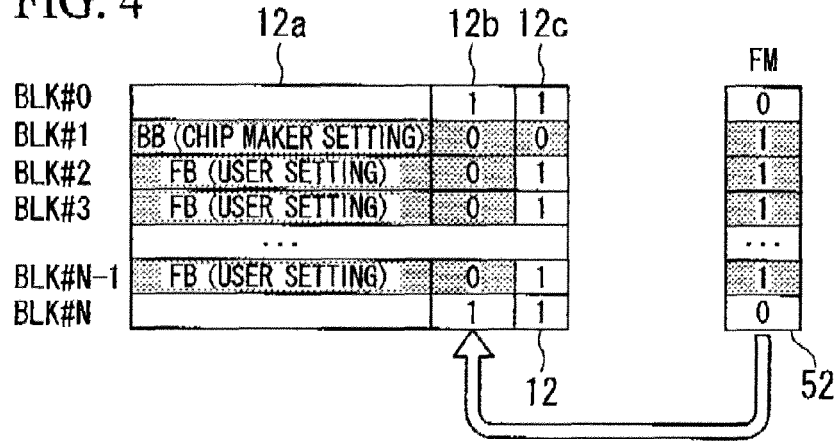
FIG. 4 is a diagram corresponding to the step of (3) marking failed blocks.

FIG. 4 is a diagram corresponding to the step of (3) marking failed blocks.

When (2) the function test is completed, the management area access unit 51 reads information stored in the failed memory unit 52 and stores '0' in the storage block in the first management area 12*b* included determined as a failed block.

In such a case, if the electrical connection between the semiconductor device 100 and the test apparatus 5 is stable, the content of the first management area 12*b* is as illustrated in FIG. 4. However, when the electrical connection between the semiconductor device 100 and the test apparatus 5 is unstable, data stored in the first management area 12*b* is uncertain.

Meanwhile, since the total number of bad blocks and failed blocks for the semiconductor device 100 having passed through the sorting test is 1022 and exceeds the prescribed value '40,' the management area access unit 51 determines the semiconductor device 100 to be defective. In addition, since the total number '1022' of the bad blocks and failed blocks is equal to or more than the reinspection condition value '512,' the management area access unit 51 determines the semiconductor device 100 subjected to the sorting test to be subjected to the sorting test again.

Moreover, when the test apparatus 5 cannot correctly perform data write and read operations with respect to the semiconductor device 100 due to connection failure from the start of the sorting test, since all storage blocks are determined as bad blocks or failed blocks in (2) the function test, the semiconductor device 100 is subjected to the sorting test again.

Furthermore, when the connection between the semiconductor device 100 and the test apparatus 5 is electrically unstable, the management area access unit 51 may not correctly read the bad block information from the first management area 12*b*. However, even in such a case, the sorting test is performed with, respect to the semiconductor device 100 as below.

First, when '0' is erroneously read from the first management area 12*b*, '1' is written to the failed memory unit 52 by the management area access unit 51. The function test is skipped for the main storage area 12*a* corresponding to the first management area 12*b*. In the step of (3) marking failed blocks, storage blocks are counted as failed blocks. The management area access unit 51 determines whether the semiconductor device 100 is good or not based on the counted number of bad blocks and failed blocks. Consequently, even when the bad block information is not correctly read from the first management area 12*b* and '0' has been read, determination for the main storage area 12a corresponding to the first management area 12b is correctly performed.

Next, when '1' is erroneously read from the first management area 12b, '0' is written to the failed memory unit 52 by the management area access unit 51. The function test is performed for the main storage area 12a corresponding to the first management area 12b. In the function test, write and read operations are performed with respect to storage blocks a plurality of times. Thus, reading of an erroneous value due to an electrically unstable connection is checked by the function test. Consequently, even when the bad block information is not correctly read from the first management area 12b and '1' has been read, determination for the main storage area 12a corresponding to the first management area 12b is correctly performed.

In this way, in the case where the connection between the test apparatus 5 and the semiconductor device 100 is electrically unstable, even when the bad block information is not correctly read from the first management area 12b, it is possible to determine whether the semiconductor device 100 is good or not by the function test according to the present embodiment.

Next, an example of the sequence of the resorting test according to the present embodiment will be described. Hereinafter, the case where the connection between a semiconductor device 100 and the test apparatus 5 is electrically stable and data write and read operations are correctly performed will be described. Furthermore, a semiconductor device 100 to be subjected to the resorting test is the semiconductor device 100 subjected to the sorting test again in the above-described sorting test.

FIGS. 5A, 5B, 5C and 6 are diagrams illustrating an example of the process of the resorting test when the connection between the semiconductor device 100 and the test apparatus 5 is electrically stable in the present embodiment. FIGS. 5A, 5B, 5C and 6 illustrate the storage states of the memory array 12 and the failed memory unit 52 in the process of the resorting test.

Figure 5A:
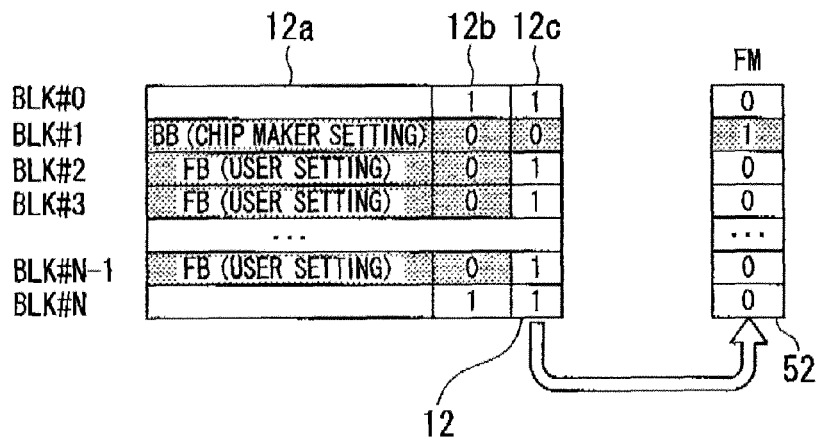
FIGS. 5A, 5B and 5C are diagrams illustrating an example of the process of the resorting test when the connection between the semiconductor device and the test apparatus is electrically stable.

FIG. 5A is a diagram corresponding to the step of (4) checking bad blocks.

Since the content of the first management area 12b in a semiconductor chip is equal to the content described in association with FIG. 4, the management area access unit 51 stores the bad block information, which is stored in the second management area 12c of the memory array 12, in the failed memory unit 52 this time. Thus, as illustrated in FIG. 5A, '1' is stored in a storage area of the failed memory unit 52 corresponding to the storage block BLK#1.

Figure 5B:
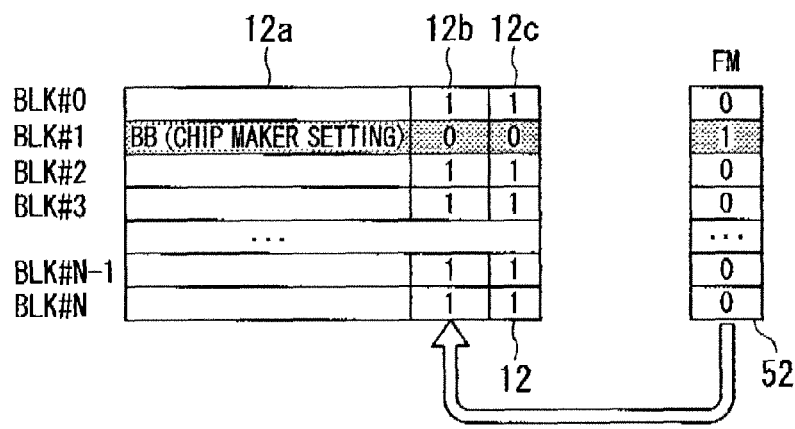

FIG. 5B is a diagram corresponding to the step of (5) restoring bad blocks.

The management area access unit 51 writes '1' to the first management areas 12b of the storage blocks BLK#0 and BLK#2 to BLK#1023 based on the information stored in the failed memory unit 52. '0' is written to the storage block BLK#1 of the first management area 12b.

Thus, the bad block information stored in the first management area 12b of the memory array 12 is restored to bad block information based on the result of the probe inspection by a chip maker.

Then, the process illustrated in FIGS. 2A, 2B and 2C is performed.

In some cases, for the semiconductor device, when a third inspection is executed after the second inspection is executed, the semiconductor device reads the first inspection result from the second management area, the semiconductor device replaces the second inspection result stored in the first management area by the first inspection result so that the first management area is restored to the first inspection result from the second inspection result.

Figure 5C:
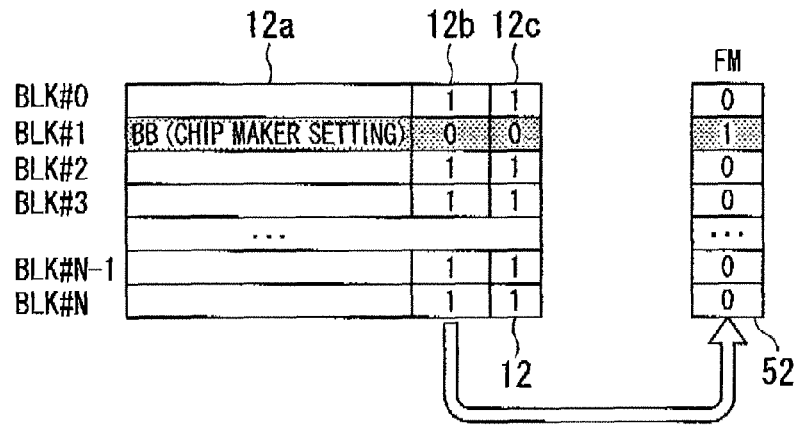

That is, as illustrated in FIG. 5C, the step of (6) checking initial bad blocks is performed, and the management area access unit 51 stores the fact that the storage block BLK#1 is a bad block in the failed memory unit 52 based on the bad block information of the first management area 12b of the memory array 12. In addition, since the probe inspection result by a chip maker is already stored in the failed memory unit 52 as illustrated in FIG. 5B, the step of FIG. 5C may be skipped.

Figure 6A:
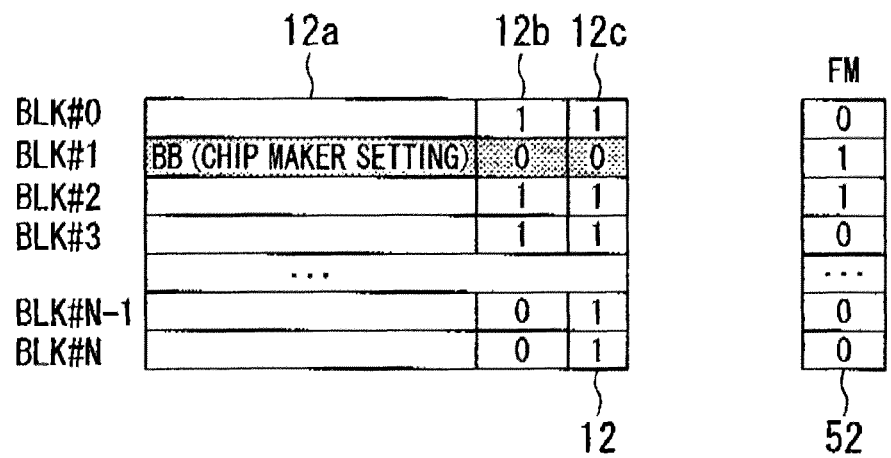
FIG. 6A is a diagrams illustrating an example of a step of a function test.

Next, as illustrated in FIG. 6A as the step of (7) the function test, when bad blocks are completely marked in the failed memory unit 52, the function test execution unit 53 performs the function test with respect to each storage block, except for the block BLK#1, of the memory array 12 based on a predetermined algorithm. As a result, if it is detected that a failure has occurred in the storage block BLK#2, the function test execution unit 53 stores '1' indicating a failed block in a storage area of the failed memory unit 52 corresponding to the storage block BLK#2.

Figure 6B:
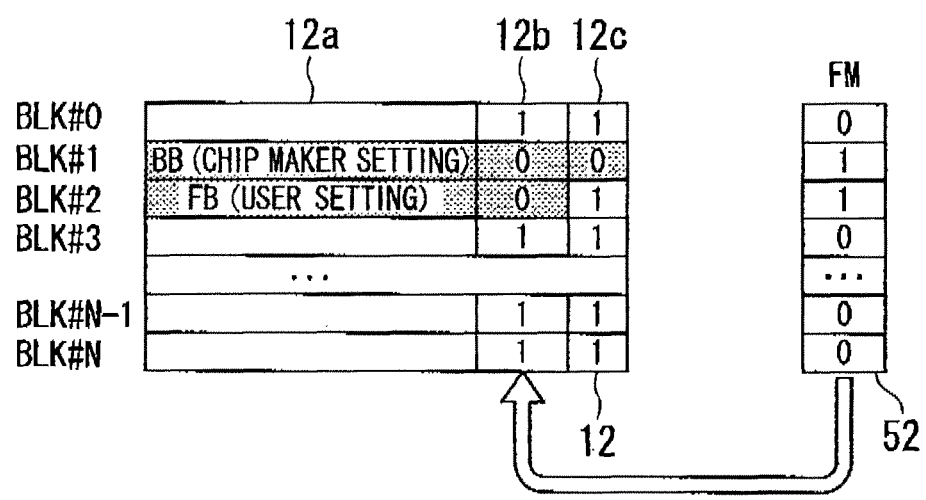
FIG. 6B is a diagram illustrating an example of a step of marking failed blocks.

Then, as illustrated in FIG. 6B as the step of (8) marking failed blocks, the management area access unit 51 updates the bad block information stored in the first management area 12b of the memory array 12 based on the information stored in the failed memory unit 52. Thereby, '0' is stored in the storage blocks (BLK#1 and BLK#2) of the first management areas 12b. Furthermore, the information indicating a failed block is also stored in the main storage area 12a.

At this time, since the total number of failed blocks and bad blocks is 2 and equal to or less than the prescribed value '40,' the management area access unit 51 determines the semiconductor device 100 subjected to the resorting test to be good.

In addition, when the data write and read operations cannot be performed in the process of the resorting test because the connection between the semiconductor device 100 and the test apparatus 5 is electrically unstable, it is highly probable that the number of failed blocks and bad blocks will exceed the reinspection condition value as mentioned above. In such a case, the semiconductor device 100 is determined to be subjected to the resorting test again.

Furthermore, when the test apparatus 5 cannot correctly perform the data write and read operations with respect to the semiconductor device 100 due to a connection failure from the start of the resorting test, all storage blocks are determined as bad blocks in (7) the function test. Even in such a case, since the number of bad blocks exceeds the reinspection condition value, the semiconductor device 100 is subjected to the sorting test again.

In the sorting test for the semiconductor device 100, the semiconductor device 100 which is good may be determined to be defective due to the factors other than the semiconductor device 100 as described above. Therefore, the resorting test is performed with respect to the semiconductor device 100. At this time, the bad block information based on the probe inspection result stored in the second management area 12c is read and the read bad block information is written to the first management area 12b (restoring bad blocks).

In this way, in the first management area 12b, the stored bad block information based on the sorting test is erased and the bad block information based on the probe inspection is restored. Consequently, even in the resorting test, it is possible to omit the function test for the storage block of the main storage area 12a, which is determined as a bad block in the probe inspection, based on the bad block information restored in the first management area 12b. As a result, the time required for the resorting test can be shortened.

According to the present embodiment, in the memory arrays 12 included in the respective semiconductor chips 1-1 to 1-n, the first management areas 12b and the second management areas 12c are provided corresponding to a plurality of main storage areas for storing data, respectively. Furthermore, bad block information indicating bad blocks detected in the probe inspection (the first inspection) and bad block information indicating failed blocks detected in the sorting test (the second inspection) are stored in the first management area 12b. Meanwhile, only the bad block information indicating the bad blocks detected in the probe inspection (the first inspection) is stored in the second management areas 12c.

When performing the resorting test (the second inspection), the test apparatus 5 reads the bad block information stored in the second management areas 12c and writes the read bad block information to the first management area 12b. Consequently, the bad block information stored in the first management area 12b can be returned to the storage state before performing the sorting test (the second inspection), and the function test for the main storage area 12a of the storage block determined as a bad block in the probe inspection can be omitted, and thus the time required for the sorting test to be performed again can be prevented from increasing.

Furthermore, by performing the sorting test again, it is possible to detect the semiconductor devices 100 which are originally good from the semiconductor devices 100 determined to be defective, and to prevent the semiconductor devices 100 which are good from being erroneously determined to be defective and discarded, thereby contributing to the reduction of the manufacturing cost of the semiconductor devices 100.

In addition, in the embodiment, the management area access unit 51 of the test apparatus 5 performs the steps of (4) checking bad blocks and (5) restoring bad blocks. However, the control units 11 provided in the semiconductor chips 1-1 to 1-n may also perform the two steps. In such a case, the test apparatus 5 outputs a dedicated control command to the semiconductor chips 1-1 to 1-n and allows the control units 11 to perform the steps of (4) checking bad blocks and (5) restoring bad blocks. Consequently, since the test apparatus 5 can perform the sorting test and the resorting test in almost the same process, time and effort for a change in the setting of the test apparatus 5 can be saved.

Moreover, in the embodiment, the test apparatus 5 performs a test different from the sorting test and the resorting test. However, the present invention is not limited thereto, For example, the test apparatus 5 may perform the resorting test (4) to (8) instead of the sorting test (1) to (3). Consequently, since it is not necessary for the test apparatus 5 to switch the sorting test and the resorting test, time for a change in the setting of the test apparatus 5 can be saved.

Furthermore, in the embodiment, the bad block information stored in the first management area 12b is read and bad blocks are stored in the failed memory unit 52, and then the function test is performed. Instead of this, the bad block information stored in the second management area 12c may be read and bad blocks may be stored in the failed memory unit 52, and then the function test may be performed. Consequently, the steps of (4) and (5) in the resorting test can be omitted, so that the time required for the resorting test can be shortened. In such a case, since it is only required to store the bad block information based on the probe inspection only in the second management area 12c, it is possible to omit a process for storing the bad block information based on the probe inspection in the first management area 12b.

The above-described test apparatus 5 may also have a computer system therein. In such a case, the processing steps of the sorting test and the resorting test as described above are stored in a computer-readable recording medium in the form of a program. The program is read and executed by a computer, so that the processes are performed. Herein, the computer-readable recording medium includes a magnetic disk, a magneto-optic disk, a CD-ROM, a DVD-ROM, a semiconductor memory and the like. Furthermore, the computer program may also be transmitted to a computer through a communication line and executed by the computer.

As is shown above, the embodiments of the present invention have been described.

It is apparent that the semiconductor devices and the layout design apparatus in accordance with the present invention is not limited to the above embodiments, but may be modified and changed without departing from the scope and spirit of the invention.

A semiconductor device and a method of manufacturing the semiconductor device according to the present invention are applicable to a semiconductor device including a vertical device including a pillar connected to a contact plug, and a method of manufacturing the same.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a NAND type flash memory array including a plurality of storage areas, as memory blocks, which store a plurality of data;
   a first management area storing a plurality of inspection results regarding whether or not each of the memory blocks of the NAND type flash memory array is a bad memory block, the plurality of inspection results being obtained by executing inspections for each of the storage areas; and
   a second management area storing the plurality of inspection results, the first and second management areas being independent from each other.

2. The semiconductor device as claimed in claim 1,
   wherein when a first inspection is executed, the semiconductor device stores a first inspection result of the plurality of inspection results into both the first management area and the second management area,
   when a second inspection is executed after the first inspection is executed, the semiconductor device replaces the first inspection result stored in the first management area by a second inspection result being obtained by the second inspection.

3. The semiconductor device as claimed in claim 2, wherein when a third inspection is executed after the second inspection is executed, the semiconductor device reads the first inspection result stored in the second management area and executes the third inspection based on the first inspection result stored in the second management area and writes a third inspection result being obtained by the third inspection into the first management area so that the second inspection result stored in the first management area is replaced by the third inspection result.

4. The semiconductor device as claimed in claim 3, wherein the first inspection corresponds to a pre-processing test of a semiconductor wafer, and the second inspection corresponds to a post-processing test to be executed after a packaging process is performed for a chip which is included a plurality of chips which is obtained from the semiconductor wafer.

5. The semiconductor device as claimed in claim 2, wherein when a third inspection is executed after the second inspection is executed, the semiconductor device reads the first inspection result stored in the second management area, the semiconductor device replaces the second inspection result stored in the first management area by the first inspection result in the second management area so that the first management area is restored to the first inspection result from the second inspection result.

6. The semiconductor device as claimed in claim 5, wherein when the third inspection is executed, the semiconductor device replaces the first inspection result restored in the first management area by a third inspection result.

7. The semiconductor device as claimed in claim 2, wherein the first inspection corresponds to a pre-processing test of a semiconductor wafer, and the second inspection corresponds to a post-processing test to be executed after a package process is performed respectively for a plurality of chips that are separated from the semiconductor wafer.

8. The semiconductor device as claimed in claim 1, wherein when a first inspection is executed, the semiconductor device stores a first inspection result into both the first management area and the second management area, the semiconductor device reads the first inspection result stored in the first management area and executes a second inspection based on the first inspection result stored in the first management area, the semiconductor device writes a second inspection result being obtained by the second inspection into the first management area so that the first inspection result stored in the first management area is replaced by the second inspection result.

9. The semiconductor device as claimed in claim 1, wherein when a first inspection is executed, the semiconductor device writes a first inspection result being obtained by the first inspection into at least the second management area, when a second inspection is executed after the first inspection is executed, the semiconductor device writes a second inspection result being obtained by the second inspection into the first management area, the second inspection result being different from the first inspection result, when a third inspection is executed after the second inspection is executed, the semiconductor device reads the first inspection result stored in the second management area and executes the third inspection based on the first inspection result stored in the second management area and replaces the second inspection result stored in the first management area by a third inspection result being obtained the third inspection so that the first management area is replaced by the third inspection result from the second inspection result.

10. The semiconductor device as claimed in claim 9, wherein the semiconductor device replaces the second inspection result stored in the first management area by the first inspection result read from the second management area, the semiconductor device reads the first inspection result from the first management area instead of reading the first inspection result from the second management area, the semiconductor device executes a third inspection based on the first inspection result stored in the first management area, the semiconductor device writes a third inspection result of the third inspection into the first management area, so that the first management area is rewritten with the third inspection result from the second inspection result via the first inspection result.

11. A semiconductor device comprising:

a plurality of first management areas corresponding to a plurality of storage areas storing a plurality of inspection results, the plurality of inspection results being obtained by executing inspections for each of a plurality of storage areas which store a plurality of data;

a plurality of second management areas corresponding to a plurality of storage areas storing the plurality of inspection results, the first and second management areas being independent from each other, wherein the semiconductor device stores the plurality of first inspection results respectively corresponding to the plurality of storage areas into at least the plurality of second management areas.

12. The semiconductor device as claimed in claim 11, wherein when a second inspection is executed after the first inspection is executed, the semiconductor device stores the plurality of second inspection results respectively corresponding to the plurality of storage areas into the plurality of first management areas, the plurality of second inspection results of the plurality of second management area are different from the plurality of first inspection results respectively, and the plurality of second inspection results correspond to the plurality of storage areas associated with the second inspection respectively.

13. The semiconductor device as claimed in claim 12, wherein when a third inspection is executed after the second inspection is executed, the semiconductor device reads the plurality of first inspection results stored in the plurality of second management area, and the semiconductor device writes a plurality of third inspection results of the third inspection associated with the plurality of storage areas into the plurality of first management areas, so that the plurality of second inspection results respectively stored in the plurality of first management areas are replaced by the plurality of third inspection results respectively.

14. The semiconductor device as claimed in claim 12, wherein when a third inspection is executed after the second inspection is executed, the semiconductor device reads the plurality of first inspection results stored in the plurality of second management areas, and the semiconductor device replaces the plurality of second inspection results stored in the plurality of first management areas by the plurality of first inspection results of the plurality of second management areas, so that the plurality of first management areas is restored with the plurality of first inspection results from the plurality of second inspection results.

15. The semiconductor device as claimed in claim 14, wherein
when the third inspection is executed, the semiconductor device replaces the plurality of first inspection results restored in the plurality of first management areas by a plurality of third inspection results corresponding to the third inspection associated with the plurality of storage areas.

16. The semiconductor device as claimed in claim 11, wherein each of the pluralities of first management areas and second management areas comprises a memory element storing one bit of the plurality of inspection results.

17. The semiconductor device as claimed in claim 16, wherein the plurality of storage areas comprises a plurality of data memory elements, and each of the data memory elements and the memory element have an substantively identical structure.

18. A semiconductor device comprising:
a plurality of main storage areas storing data;
a plurality of first management areas corresponding to the plurality of main storage areas respectively, the plurality of first management areas storing a plurality of failure information indicating whether the plurality of main storage areas are failure areas or non-failure areas; and
a plurality of second management areas respectively indicating whether the plurality of main storage areas are failure areas or non-failure areas, the plurality of second management areas corresponding to the plurality of main storage areas respectively,
wherein the plurality of first management areas respectively store a plurality of failure information formed by respectively merging a plurality of first inspection results and a plurality of second inspection results, the plurality of first inspection results are obtained by executing a first inspection, the plurality of second inspection results are obtained by executing a second inspection after the first inspection is executed, and
the plurality of second management areas respectively store the first inspection results without storing the second inspection results.

19. The semiconductor device as claimed in claim 18, wherein
each of the pluralities of first management areas and second management areas comprises a memory element storing one bit of the plurality of failure information.

20. The semiconductor device as claimed in claim 19, wherein
the plurality of storage areas comprises a plurality of data memory elements, and each of the plurality of data memory elements and the memory element have an substantively identical structure.

21. The semiconductor device as claimed in claim 18, wherein
when the second inspection is executed again, the second inspection is re-executed based on the plurality of failure information stored in the plurality of second management areas to obtain a second plurality of second inspection results, and the second plurality of second inspection results and the plurality of first inspection results are memorized respectively into the plurality of first management areas.

22. The semiconductor device as claimed in claim 18, wherein when the second inspection is executed again, the plurality of failure information in the plurality of second management areas are respectively stored into the plurality of first management areas,
the second inspection is re-executed to obtain a second plurality of second inspection results based on the plurality of failure information respectively stored in the plurality of first management areas, and
the second plurality of second inspection results and the plurality of first inspection results are memorized respectively into the plurality of first management areas.

23. The semiconductor device as claimed in claim 18, wherein the second inspection is executed to a plurality of first non-failure areas in the plurality of main storage areas, the plurality of first non-failure areas are respectively determined to be non-failure areas by the first inspection is executed,
when the plurality of first non-failure areas is determined to be a failure area by the second inspection is executed, a plurality of failure information is stored into the plurality of the first management areas corresponding to the plurality of main storage areas.

24. The semiconductor device as claimed in claim 18, wherein the first inspection corresponds to a pre-processing test of a semiconductor wafer, and the second inspection corresponds to a post-processing test being executed after a packaging process is performed respectively for a plurality of chips that are separated from the semiconductor wafer.

25. A semiconductor test method comprising:
testing a first inspection with a plurality of storage areas, the first inspection resulting a plurality of first inspection results, the plurality of storage areas storing a plurality of data;
storing the plurality of first inspection results into at least a plurality of second management areas among a plurality of first management areas and the plurality of second management areas corresponding to the plurality of storage areas;
reading the plurality of first inspection results from the plurality of second management areas;
testing a second inspection after the first inspection is executed, the second inspection being executed to a plurality of non-failure areas in the plurality of storage areas based on the plurality of first inspection results of the second management areas, the first inspection results indicate whether the plurality of storage areas are non-failure areas or failure areas; and
storing a plurality of second inspection results that relating the second inspection respectively corresponding to the plurality of non-failure areas of the plurality of storage area into the plurality of first management areas.

26. The semiconductor test method as claimed in claim 25, further comprising:
re-reading the plurality of first inspection results as a second plurality of first inspection results from the plurality of second management areas after the second inspection is executed;
testing a third inspection after the second inspection is executed to the plurality of storage areas corresponding to the plurality of non-failure areas based on the second plurality of first inspection results and causing a plurality of third inspection results; and
storing the plurality of third inspection results respectively corresponding to the plurality of storage areas into the plurality of first management areas.

27. The semiconductor test method as claimed in claim 25, wherein when the first inspection is executed, the plurality of first inspection results is stored into both the plurality of first management areas and the plurality of second management areas.

28. The semiconductor test method as claimed in claim 27, wherein
when a third inspection is executed after the second inspection is executed, the plurality of first inspection results read from the plurality of second management areas, the plurality of first inspection results of the plurality of second management areas is re-stored into the plurality of first management areas which the plurality of second inspection results has been stored, so that the plurality of second inspection results stored in the plurality of first management areas is replaced by the plurality of first inspection results.

29. The semiconductor test method as claimed in claim 28, wherein
executing the third inspection which comprises verifying the plurality of first inspection results re-stored in the plurality of first management areas and the first inspection results stored in the plurality of second management areas.

30. The semiconductor test method as claimed in claim 28, further comprising:
reading, when the third inspection is executed, the plurality of first inspection results respectively from the plurality of first management areas instead of reading the plurality of first inspection results respectively from the plurality of second management areas;
testing the third inspection to each of the plurality of storage areas respectively corresponding to the non-failure area based on the plurality of first inspection results of the plurality of first management areas; and
storing the plurality of third inspection results respectively corresponding to the plurality of storage areas having been executed by the third inspection into the plurality of first management areas.

31. The semiconductor test method as claimed in claim 25, wherein
skipping the second inspection to a test of the plurality of storage areas where the plurality of first inspection results indicate the failure areas of the plurality of storage areas.

32. The semiconductor test method as claimed in claim 26, wherein
skipping the third inspection to a test of the plurality of storage areas where the plurality of first inspection results indicate the failure areas of the plurality of storage areas.

* * * * *